United States Patent
Ohuchi et al.

(10) Patent No.: US 8,201,450 B2
(45) Date of Patent: Jun. 19, 2012

(54) ANGULAR VELOCITY SENSOR

(75) Inventors: Satoshi Ohuchi, Hyogo (JP); Hiroyuki Aizawa, Osaka (JP)

(73) Assignee: Panasonic Corporation, Osaka (JP)

( * ) Notice: Subject to any disclaimer, the term of this patent is extended or adjusted under 35 U.S.C. 154(b) by 359 days.

(21) Appl. No.: 12/672,925

(22) PCT Filed: Aug. 21, 2008

(86) PCT No.: PCT/JP2008/002257
§ 371 (c)(1),
(2), (4) Date: Feb. 10, 2010

(87) PCT Pub. No.: WO2009/034682
PCT Pub. Date: Mar. 19, 2009

(65) Prior Publication Data
US 2011/0203371 A1    Aug. 25, 2011

(30) Foreign Application Priority Data
Sep. 13, 2007    (JP) .................................. 2007-237719

(51) Int. Cl.
*G01C 19/00*    (2006.01)
(52) U.S. Cl. .................... 73/504.12; 73/514.02
(58) Field of Classification Search ............... 73/504.12, 73/488, 493, 504.02, 514.02
See application file for complete search history.

(56) References Cited

U.S. PATENT DOCUMENTS

| | | | | |
|---|---|---|---|---|
| 5,176,033 A * | 1/1993 | Jones et al. | ...................... | 73/597 |
| 5,522,249 A * | 6/1996 | Macy | .............................. | 73/1.37 |
| 5,814,920 A * | 9/1998 | Takeuchi et al. | .............. | 310/330 |
| 6,093,338 A * | 7/2000 | Tani et al. | ................. | 252/62.9 R |
| 6,119,518 A * | 9/2000 | Itou et al. | .................... | 73/504.16 |
| 6,411,017 B1 * | 6/2002 | Qiu et al. | ....................... | 310/358 |
| 6,610,361 B1 * | 8/2003 | Heuer et al. | ............. | 427/255.18 |
| 6,644,117 B1 * | 11/2003 | Kueck et al. | .................... | 73/488 |
| 6,865,945 B2 * | 3/2005 | Hayashi et al. | ............ | 73/504.16 |
| 6,880,399 B1 * | 4/2005 | Okoshi et al. | .................... | 73/493 |
| 6,992,421 B2 * | 1/2006 | Ikeda et al. | .................... | 310/328 |
| 7,002,284 B2 * | 2/2006 | Ouchi et al. | ................... | 310/370 |
| 7,107,843 B2 * | 9/2006 | Ohuchi et al. | ............. | 73/504.16 |
| 7,436,107 B2 * | 10/2008 | Aizawa et al. | ................ | 310/370 |
| 7,913,560 B2 * | 3/2011 | Higuchi et al. | ............ | 73/504.16 |

(Continued)

FOREIGN PATENT DOCUMENTS

| | | |
|---|---|---|
| JP | 09-287957 A | 11/1997 |
| JP | 11-230759 A | 8/1999 |
| JP | 2001-082963 A | 3/2001 |
| JP | 2005-003588 A | 1/2005 |
| JP | 2006-017538 A | 1/2006 |
| JP | 2006-162315 A | 6/2006 |
| WO | 2006/006361 A1 | 1/2006 |

OTHER PUBLICATIONS

International Search Report for PCT/JP2008/002257.

*Primary Examiner* — Hezron E Williams
*Assistant Examiner* — Samir M Shah
(74) *Attorney, Agent, or Firm* — Pearne & Gordon LLP

(57) ABSTRACT

An angular velocity sensor comprising a fixed part, a weight coupled with the fixed part via a flexible part having a bending part, a first electrode disposed outside the bending part, and a second electrode disposed inside the bending part, in which the first electrode and the second electrode have an upper electrode and a lower electrode interposed by a piezoelectric layer, respectively, and the width of the first electrode is smaller than the width of the second electrode, and the difference of the amounts of electric charges generated at the first electrode and the second electrode can be suppressed thereby improving the accuracy of detection.

3 Claims, 8 Drawing Sheets

U.S. PATENT DOCUMENTS

| | | | |
|---|---|---|---|
| 7,950,282 B2 * | 5/2011 | Higuchi et al. | 73/514.34 |
| 7,954,377 B2 * | 6/2011 | Higuchi et al. | 73/514.34 |
| 7,977,853 B2 * | 7/2011 | Fujii et al. | 310/358 |
| 8,084,925 B2 * | 12/2011 | Shibata et al. | 310/358 |
| 2001/0000853 A1 * | 5/2001 | Yachi et al. | 73/504.16 |
| 2002/0089409 A1 * | 7/2002 | Ishii | 338/22 R |
| 2004/0007065 A1 * | 1/2004 | Fujimoto et al. | 73/514.15 |
| 2005/0127795 A1 * | 6/2005 | Torii et al. | 310/360 |
| 2006/0272412 A1 * | 12/2006 | Ohuchi et al. | 73/504.16 |
| 2011/0148547 A1 * | 6/2011 | Zhang | 333/187 |
| 2011/0234206 A1 * | 9/2011 | Kawakubo et al. | 324/162 |

* cited by examiner

ANGULAR VELOCITY SENSOR

TECHNICAL FIELD

The present invention relates to angular velocity sensors to be used in various electronic devices such as for posture control and navigation of moving vehicles.

BACKGROUND ART

Referring to FIG. 5 to FIG. 8, description of conventional types of angular velocity sensors as disclosed in Patent Literature 1 will be given. FIG. 5 is a top view of a conventional angular velocity sensor and FIG. 6 is an enlarged plan view of part A in FIG. 5. FIG. 7 is a sectional view taken along line 7-7 in FIG. 6. FIG. 8 is a perspective view of a conventional angular velocity sensor.

As shown in FIG. 5, a conventional angular velocity sensor comprises frame-shaped fixed part 1 and weight 10 coupled inward of fixed part 1 through flexible part 2. Flexible part 2 has at least one bending part 2A. Also, as shown in FIG. 6, conventional angular velocity sensor 2 has first electrode 3 disposed on the outside and second electrode 4 disposed on the inside at bending part 2A. As shown in FIG. 7, first electrode 3 and second electrode 4 are so structured that piezoelectric layers 3C, 4C are sandwiched between upper electrodes 3A, 4A and lower electrode 3B, 4B, respectively. Here, third electrode 15 disposed between first electrode 3 and second electrode 4 is a wiring electrode to be connected with an electrode for detecting acceleration and has the same structure as that of first electrode 3 and second electrode 4.

Low accuracy of detection of conventional angular velocity sensors having such a structure has been a problem for the reason described below.

In the conventional structure as shown in FIG. 6, as the electrodes are made with the same width, the area of first electrode 3 disposed on the outside becomes greater by necessity than the area of second electrode 4 disposed on the inside. Accordingly, as shown in FIG. 8, even in the event of a force being applied to weight 10 in a direction perpendicular to fixed part 1, the amount of electric charges generated due to distortion of piezoelectric layer 3C at first electrode 3 shown in FIG. 7 becomes greater than the amount of electric charges generated due to distortion of piezoelectric layer 4C in second electrode 4. As a result, erroneous detection has been made that the angular velocity around an axis perpendicular to fixed part 1 had occurred rather than in the direction perpendicular to fixed part 1.

That is, the angular velocity around an axis perpendicular to fixed part 1 is originally to be detected by subtracting the sum of the electric charges generated at lower electrode 3B of first electrode 3 and the electric charges generated at upper electrode 4A of second electrode 4 from the sum of the electric charges generated at upper electrode 3A of first electrode 3 shown in FIG. 7 and the electric charges generated at lower electrode 4B of second electrode 4.

However, in the case a force is applied in a direction perpendicular to fixed part 1, the electric charges generated at upper electrode 3A and lower electrode 4B shown in FIG. 7 are not cancelled each other, nor are the electric charges generated at upper electrode 4A and lower electrode 3B cancelled each other. Accordingly, the amount of electric charges due to distortion of piezoelectric layer 3C in first electrode 3 disposed on the outside of bending part 2A is greater than the electric charges generated due to distortion of piezoelectric layer 4C in second electrode 4 disposed on the inside of bending part 2A.

For the above reasons, with conventional angular velocity sensors, even in the case a force is applied to fixed part 1 in a perpendicular direction, erroneous detection is made that angular velocity around an axis perpendicular to fixed part 1 was generated, thus resulting in lowered accuracy.

[Patent Literature 1] Unexamined Japanese Patent Publication No. 2005-3588

SUMMARY OF THE INVENTION

The present invention provides angular velocity sensors that are free from erroneous detection and that have high detection accuracy.

The angular velocity sensor in accordance with the present invention comprises a fixed part, a weight coupled with the fixed part through a flexible part having a bending part, a first electrode disposed outside the bending part and a second electrode disposed inside the bending part, where the first electrode and the second electrode respectively has an upper electrode and a lower electrode interposed by a piezoelectric layer, and the width of the first electrode is narrower than the width of the second electrode.

With this structure, in the event a force is applied to the weight in a direction perpendicular to the fixed part, the difference in the amount of electric charges generated in the first electrode located on the outside and the amount of electric charges generated in the second electrode located on the inside can be suppressed. As a result, the accuracy of detection can be improved.

Figure 1:
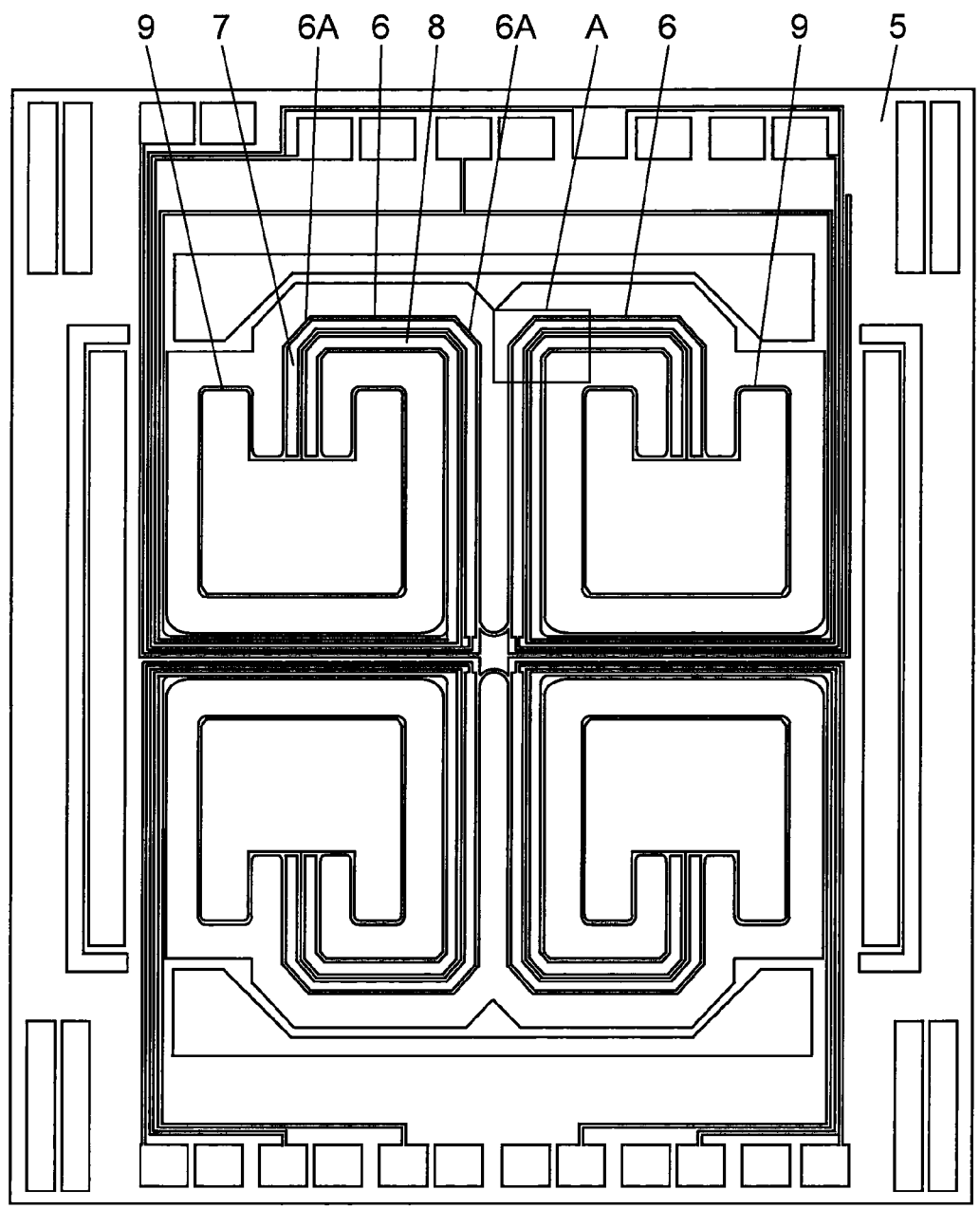
FIG. 1 is a top view of an angular velocity sensor in accordance with a preferred embodiment of the present invention.

REFERENCE SIGNS LIST 5 fixed part
6 flexible part
7 first electrode
7A, 8A, 16A upper electrodes
7B, 8B, 16B lower electrodes
7C, 8C, 16C piezoelectric layers
8 second electrode
9 weight
16 third electrode
17 substrate

DETAILED DESCRIPTION OF PREFERRED EMBODIMENTS

Exemplary Embodiment

Referring to drawings, description of an angular velocity sensor in accordance with an exemplary embodiment of the present will be given.

Figure 2:
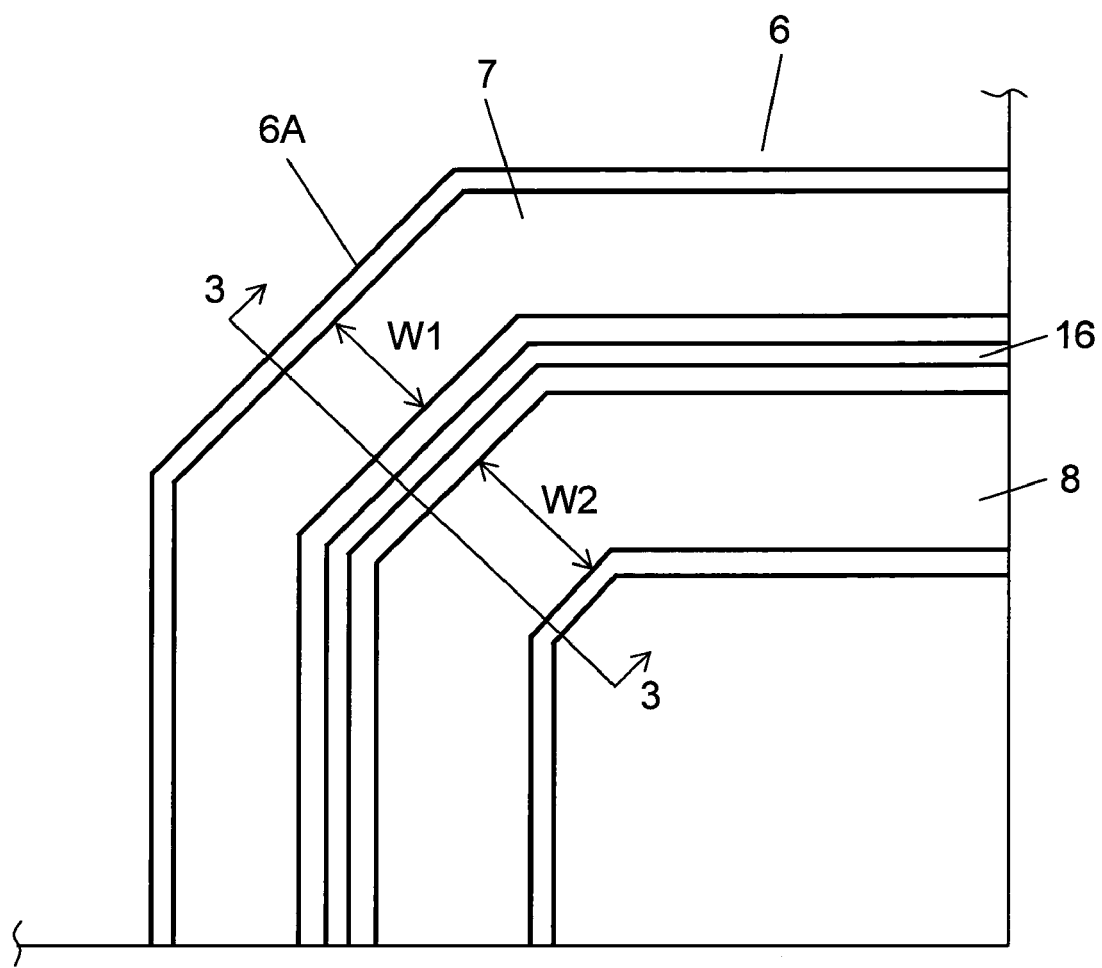
FIG. 2 is an enlarged top view of section A in FIG. 1.
Figure 3:
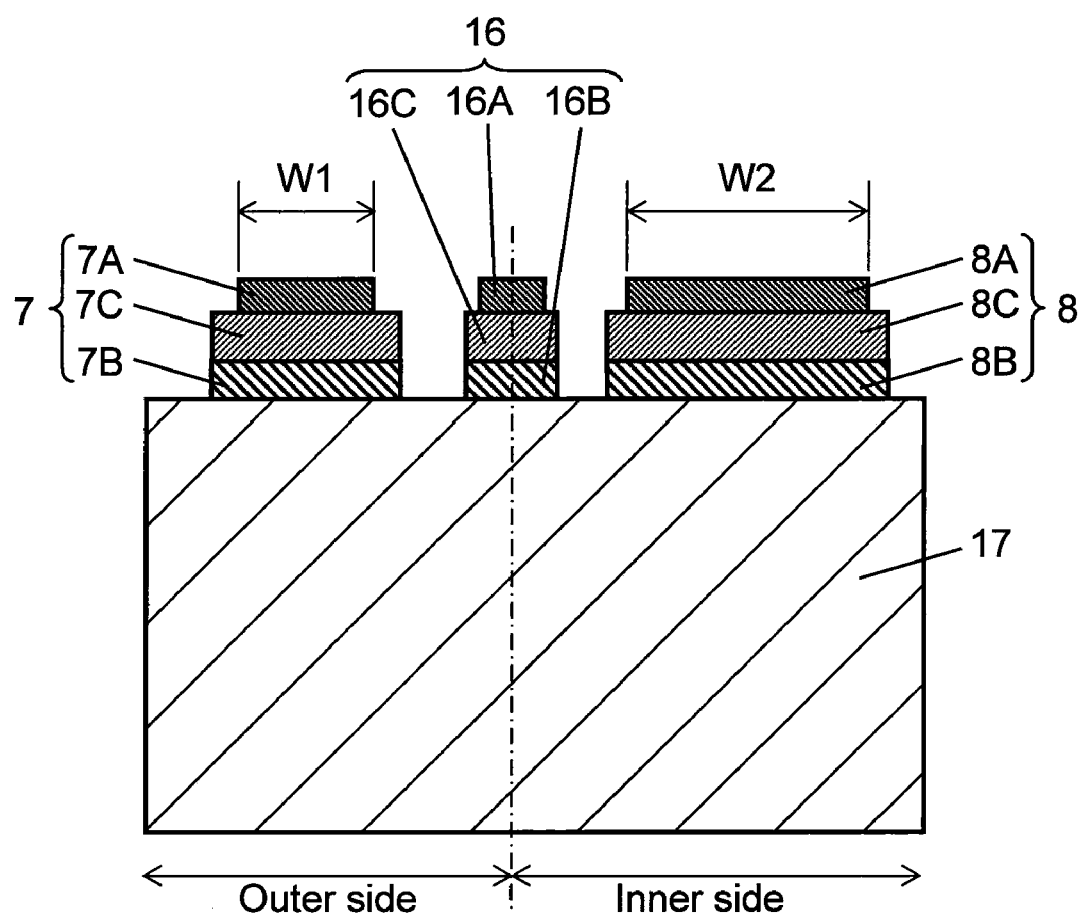
FIG. 3 is a sectional view cut along line 3-3 in FIG. 2.

As shown in FIG. 1, the angular velocity sensor in accordance with the exemplary embodiment comprises frame-shaped fixed part 5 and weight 9 coupled to inner side of fixed part 5 via flexible part 6, and flexible part 6 has at least one bending part 6A. And, as shown in FIG. 2 which is an enlarged view of section A in FIG. 1, flexible part 6 has first electrode 7 disposed outside of bending part 6A and second electrode 8 disposed inside of bending part 6A. As shown in FIG. 3, first electrode 7 and second electrode 8 are respectively so structured on substrate 17 that a silicon substrate or a silicon-on-insulator substrate that piezoelectric layers 7C, 8C are interposing between upper electrodes 7A, 8A and lower electrodes 7B, 8B. Here, width W1 of first electrode 7 is designed to be smaller than width W2 of second electrode 8. In FIG. 2, third electrode 16 provided between first electrode 7 and second electrode 8 is a wiring electrode to be connected to an electrode (not shown) formed on weight 9 for detecting acceleration. As shown in FIG. 3, third electrode 16 has a structure in which piezoelectric layer 16C interposes between upper electrode 16A and lower electrode 16B much like first electrode 7 and second electrode 8. In addition, gold and the like material is used for each of the upper electrodes 7A, 8A, 16A and lower electrodes 7B, 8B, 16B, while lead zirconate titanate and the like is used for each of piezoelectric layers 7C, 8C, 16C.

In the above, description was made using widths W1, W2 of the upper electrodes. This is because the electric charges generated due to distortion of the piezoelectric layer are generated between the upper and the lower electrodes, and the electric charges are dependent on narrower electrode width.

In the event a passenger car mounted with an angular velocity sensor structured as above changes its direction of travel to right or left, namely, when angular velocity is generated around an axis perpendicular to fixed part 5 in FIG. 1, the angular velocity is detected by the following procedure.

To begin with, when angular velocity is generated around an axis perpendicular to fixed part 5, electric charges due to distortion of piezoelectric layer 7C are generated in upper electrode 7A and lower electrode 7B of first electrode 7 shown in FIG. 3. Similarly, electric charges are generated in upper electrode 8A and lower electrode 8C of second electrode 8 shown in FIG. 3 due to distortion of piezoelectric layer 8C.

Based on this, an angular velocity control circuit (not shown) calculates a value obtained by subtracting the sum of the electric charges generated at lower electrode 7B of first electrode 7 and the electric charges generated at upper electrode 8A of second electrode 8 from the sum of the electric charges generated at upper electrode 7A of first electrode 7 and the electric charges generated at lower electrode 8B of second electrode 8 shown in FIG. 3, and the angular velocity which is occurring is detected based on this value.

In this exemplary embodiment, width W1 of first electrode 7 is designed to be smaller than width W2 of second electrode 8. With this, at bending part 6A shown in FIG. 1, the difference of the area of first electrode 7 disposed on the outside and the area of second electrode 8 disposed on the inside can be decreased. That is, the area of first electrode 7 disposed on the outside can be made approximately equal to that of second electrode 8 disposed on the inside.

Figure 4:
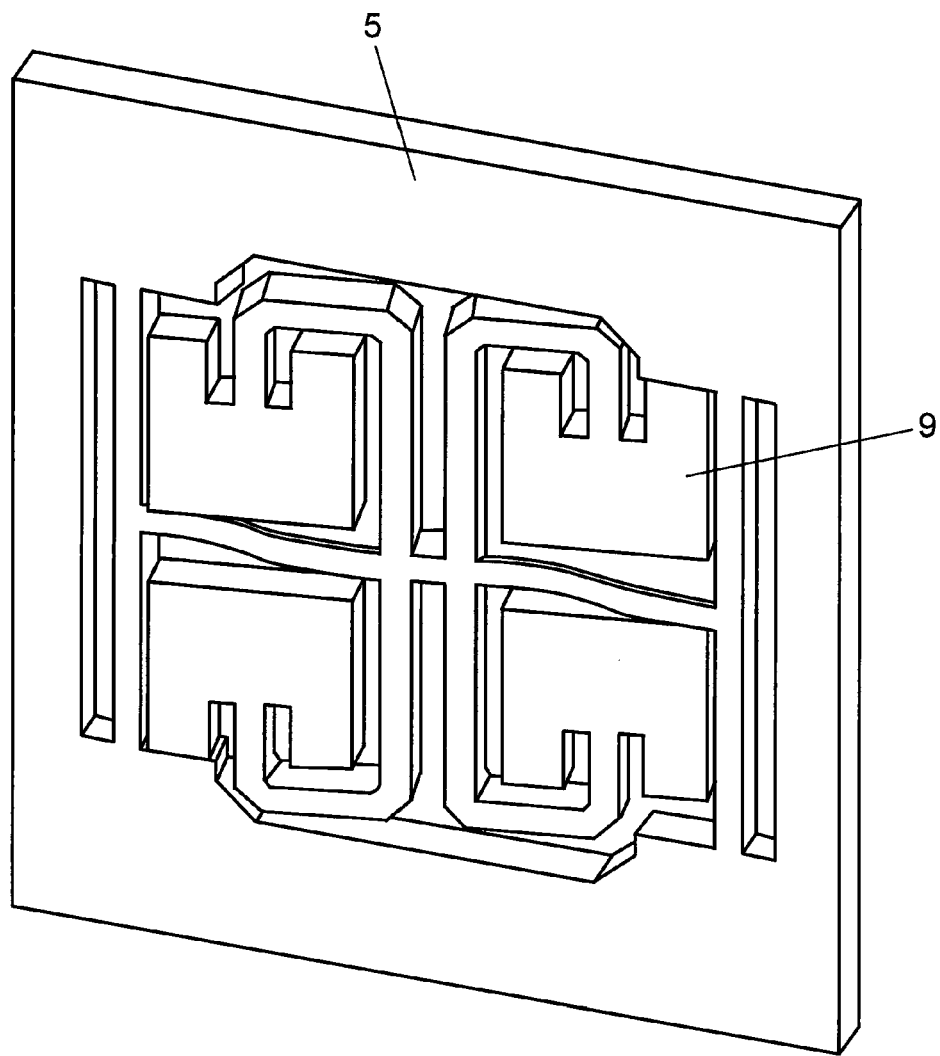
FIG. 4 is a perspective view of the angular velocity sensor in the preferred embodiment of the present invention.
Figure 5:
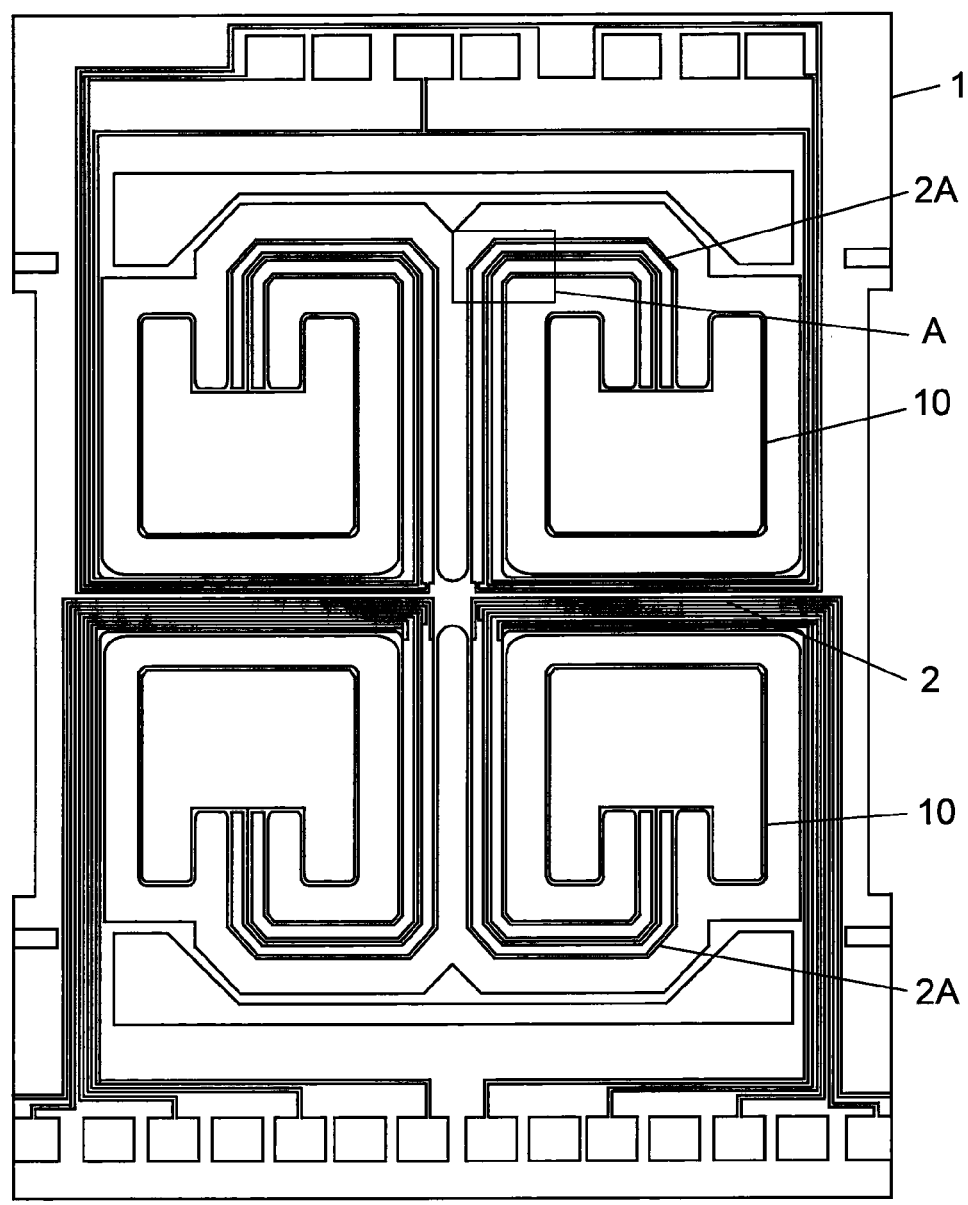
FIG. 5 is a top view of a conventional angular velocity sensor.
Figure 6:
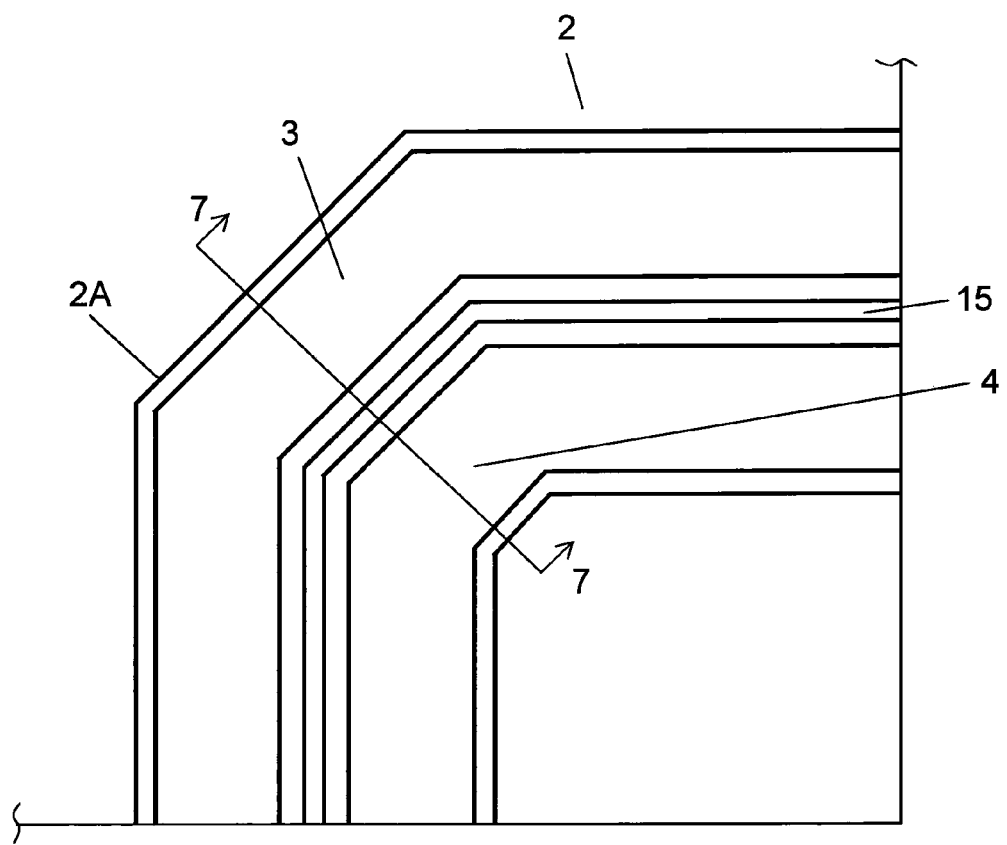
FIG. 6 is an enlarged top view of section A in FIG. 5.
Figure 7:
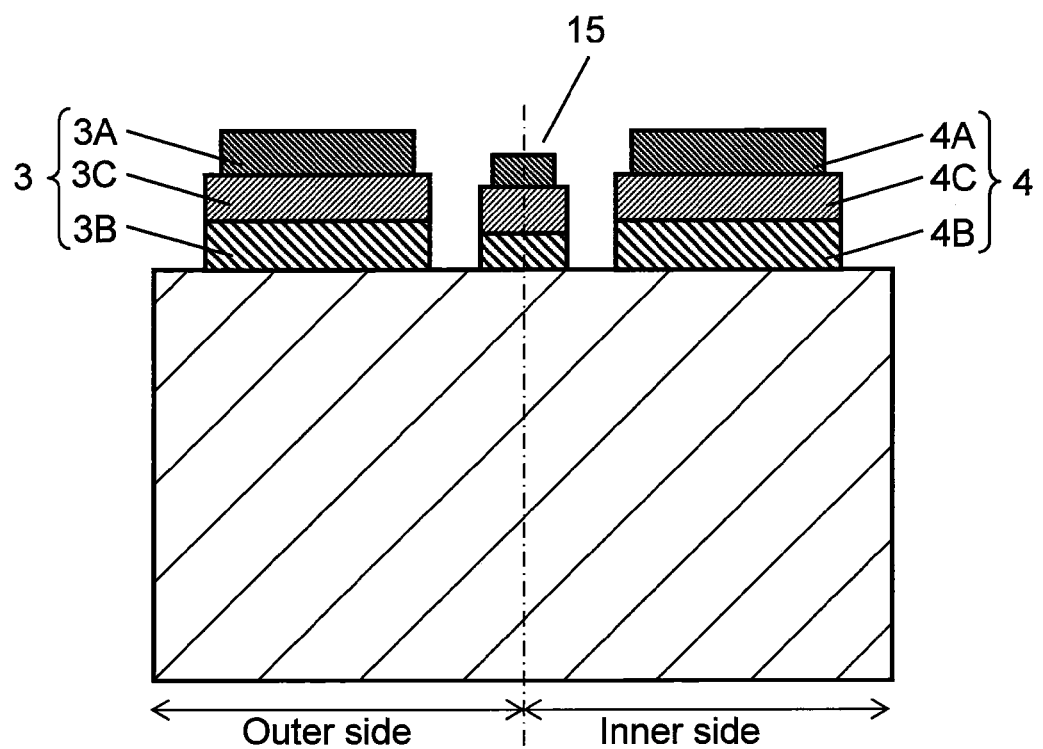
FIG. 7 is a sectional view cut along line 7-7 in FIG. 6.
Figure 8:
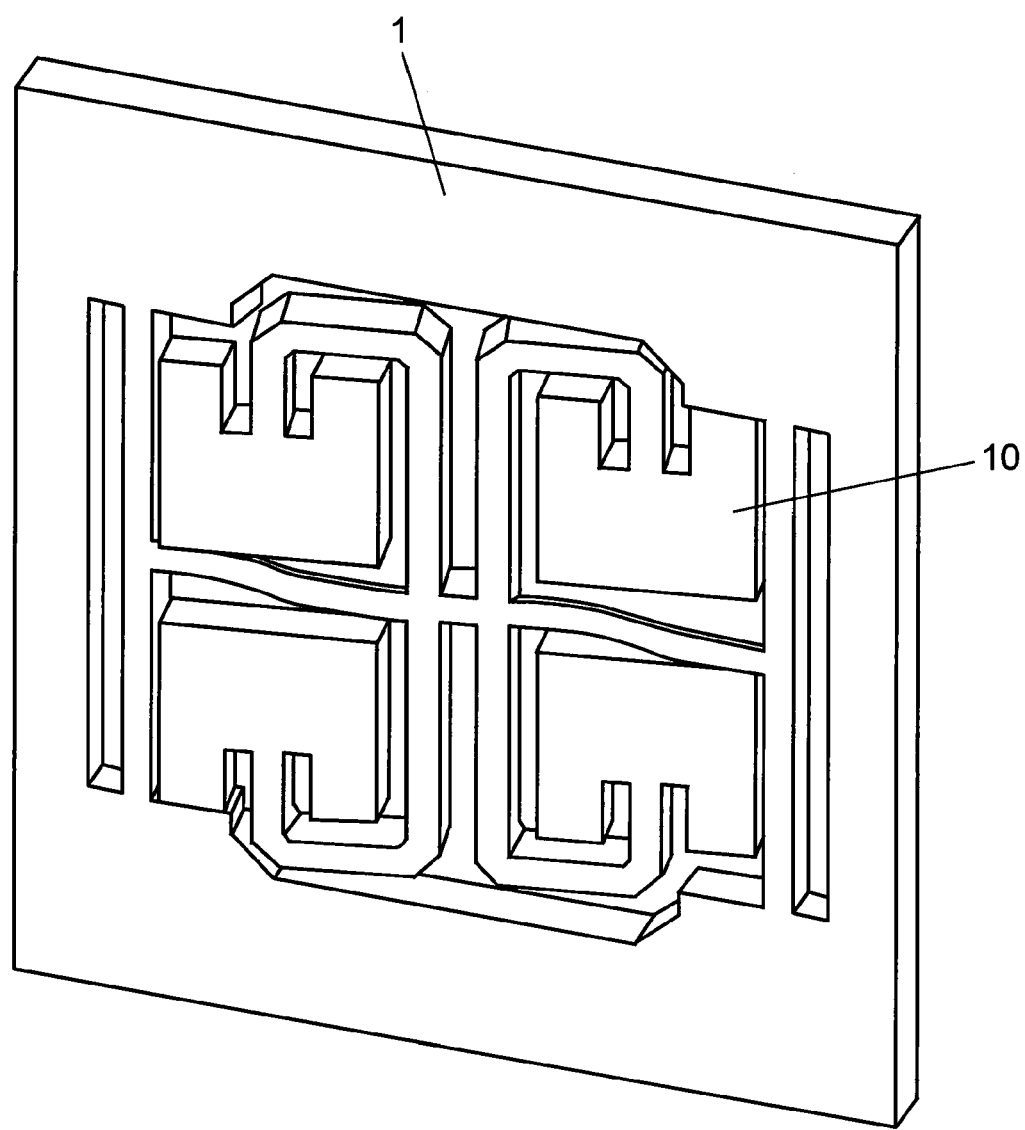
FIG. 8 is a perspective view of a conventional angular velocity sensor.

Accordingly, as shown in FIG. 4, even in a case a force is applied to weight 9 in a direction perpendicular to fixed part 5, the difference of the electric charges generated at first electrode 7 and the electric charges generated at second electrode 8 can be controlled almost to zero. As a result, in an event a force is applied to weight 9 in a direction perpendicular to fixed part 5, detection accuracy can be improved without erroneously detecting that angular velocity around an axis perpendicular to fixed part 5 has been generated.

Here, it is desirable to make the area of first electrode 7 slightly larger rather than making the areas of first electrode 7 and second electrode 8 perfectly equal. This is because the amounts of distortions generated in piezoelectric layers 7C, 8C shown in FIG. 3 are different.

That is, as the outer side of bending part 6A has high flexibility, the amount of distortion for a given applied force is low, whereas, as the inner side of bending part 6A has low flexibility, the quantity of distortion becomes large. Accordingly, the amount of electric charges generated per unit area becomes smaller on the outer side of bending part 6A than that on the inner side. Consequently, it is possible to attain detection with higher accuracy by making the width of first electrode 7 to be disposed outside of bending part 6A smaller than that of second electrode 8 and making the area of first electrode 7 greater than that of second electrode 8.

In the meantime, in this exemplary embodiment, first electrode 7 and second electrode 8 were formed by dry etching using photolithography technology. As electrode patterns can be formed in a lump by using photolithography, it is possible to form width of all of the electrodes of flexible parts with a high degree of precision as designed. Also, as it is possible to form electrodes with arbitrary widths by the same process as making normal electrode pattern formation process, electrodes can be formed without increasing the man-hours. However, in an event a force is applied to weight 9 in a direction perpendicular to fixed part 5 by adjusting the width of first electrode 7 or second electrode 8 by electrode trimming, it is possible to inhibit the difference in the amounts of electric charges generated at first electrode 7 and second electrode 8 to null.

In the meantime, in a traditional electrode trimming method in general, total quantity of electric charges generating in first electrode 7 and second electrode 8 of four flexible parts 6 may be controlled such as by adjusting the width of first electrode 7 or second electrode 8 of one flexible part 6. However, with such electrode trimming, though it is possible to control the amount of electric charges generated at first electrode 7 and second electrode 8 in a certain vibration mode (for instance, vertical vibration mode of fixed part 5), it is not possible to cope with all of other various vibration modes (for instance, vibration mode of fixed part 5 in the horizontal direction or vibration mode around an axis orthogonal to the vertical direction of fixed part 5).

Accordingly, in this preferred embodiment, when to avoid erroneous detection by electrode trimming, it is necessary to make electrode trimming in a manner such that the amount of electric charges generated at first electrode 7 and second electrode 8 be controlled for each of the four flexible parts 6 in an event a force is applied to weight 9 in a direction perpendicular to fixed part 5, thus worsening productivity.

In comparison, productivity can be enhanced in this preferred embodiment by etching such as by photolithography, and by adopting a structure in which the width of first electrode 7 is smaller than the width of second electrode 8. In addition, erroneous detection can be avoided by cancelling out differences in the electric charges generating in first electrode 7 and second electrode 8 at each of flexible parts 6.

In the preferred embodiment as described above, width W1 of first electrode 7 at bending part 6A is made smaller than width W2 of second electrode 8. However, it is also effective to make first electrode 7 thinner than second electrode 8 at flexible parts 6 other than at bending part 6A.

INDUSTRIAL APPLICABILITY

As the angular velocity sensor in accordance with the present invention does not make erroneous detection and has high precision of detection as described above, it is useful in various electronic devices such as for posture control and navigation of moving vehicles.

The invention claimed is:

1. An angular velocity sensor comprising a fixed part, a weight coupled with the fixed part via a flexible part having a bending part, a first electrode disposed outside the bending part, and a second electrode disposed inside the bending part, wherein the first electrode and the second electrode respectively have an upper electrode and a lower electrode interposed by a piezoelectric layer, and wherein a width of the first electrode is smaller than a width of the second electrode.

2. The angular velocity sensor of claim 1, wherein the fixed part is in the form of a frame and the weight is disposed on an inner side of the frame.

3. The angular velocity sensor of claim 1, wherein an area of the first electrode is greater than an area of the second electrode.

* * * * *